US012665288B2

(12) United States Patent
Yoon et al.

(10) Patent No.: US 12,665,288 B2
(45) Date of Patent: Jun. 23, 2026

(54) DISPLAY DEVICE

(71) Applicant: LG ELECTRONICS INC., Seoul (KR)

(72) Inventors: Jihyo Yoon, Seoul (KR); Dongwoo Kim, Seoul (KR); Hyunchul Moon, Seoul (KR); Seokwoo Kwon, Seoul (KR); Yonghan Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 191 days.

(21) Appl. No.: 18/577,577

(22) PCT Filed: Jul. 9, 2021

(86) PCT No.: PCT/KR2021/008840
§ 371 (c)(1),
(2) Date: Jan. 8, 2024

(87) PCT Pub. No.: WO2023/282374
PCT Pub. Date: Jan. 12, 2023

(65) Prior Publication Data
US 2024/0332782 A1      Oct. 3, 2024

(51) Int. Cl.
*H01Q 1/24* (2006.01)
*H05K 7/20* (2006.01)
*H05K 9/00* (2006.01)

(52) U.S. Cl.
CPC .......... *H01Q 1/24* (2013.01); *H05K 7/20963* (2013.01); *H05K 9/0054* (2013.01)

(58) Field of Classification Search
CPC ..... H01Q 1/24; H05K 7/20963; H05K 9/0054
See application file for complete search history.

(56) References Cited

U.S. PATENT DOCUMENTS

| 2003/0124985 A1* | 7/2003 | Shin | G06F 1/1616 |
| | | | 455/82 |
| 2014/0354888 A1* | 12/2014 | Nakamura | G06F 1/1632 |
| | | | 348/725 |
| 2015/0155613 A1* | 6/2015 | Hotta | H01Q 13/16 |
| | | | 343/702 |

(Continued)

FOREIGN PATENT DOCUMENTS

| KR | 10-2018-0025669 | 3/2018 |
| KR | 10-2019-0061936 | 6/2019 |

(Continued)

OTHER PUBLICATIONS

PCT International Application No. PCT/KR2021/008840, International Search Report dated Mar. 30, 2022, 4 pages.

*Primary Examiner* — Hai V Tran
(74) *Attorney, Agent, or Firm* — LEE, HONG, DEGERMAN, KANG & WAIMEY

(57)      ABSTRACT

A display device is disclosed. The display device of the present disclosure comprises: a display panel; a frame positioned at the rear of the display panel and having the display panel coupled thereto; a communication module outwardly protruding from the frame from one side of the frame, and provided with an antenna unit; and a first board coupled to the frame and electrically connected to the communication module, wherein the first board is disposed so as to be closer to the one side than the other side of the frame opposite from the one side.

14 Claims, 15 Drawing Sheets

(56)                    References Cited

U.S. PATENT DOCUMENTS

2018/0247574 A1*  8/2018  Hall ................... H05K 7/20136
2020/0021016 A1*  1/2020  Son ...................... H01Q 21/062
2022/0217855 A1*  7/2022  Lee ......................... G06F 3/147
2023/0171537 A1*  6/2023  Lee .......................... H04N 5/64
                                                            381/337
2024/0160243 A1*  5/2024  Chae ................. G02F 1/133314

FOREIGN PATENT DOCUMENTS

KR      10-2019-0083264        7/2019
KR           10-2260459        6/2021
WO          2017-213279       12/2017

* cited by examiner

[FIG. 1]
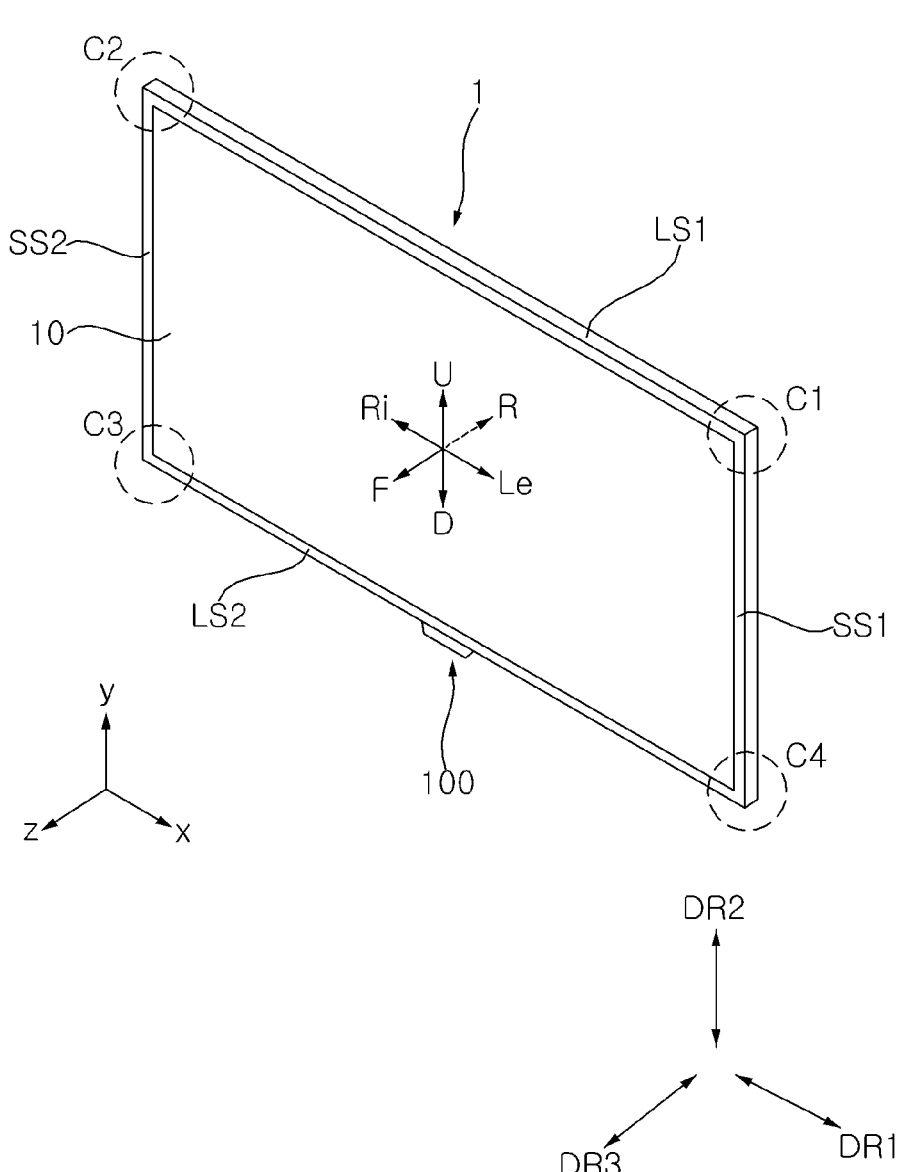

[FIG. 2]
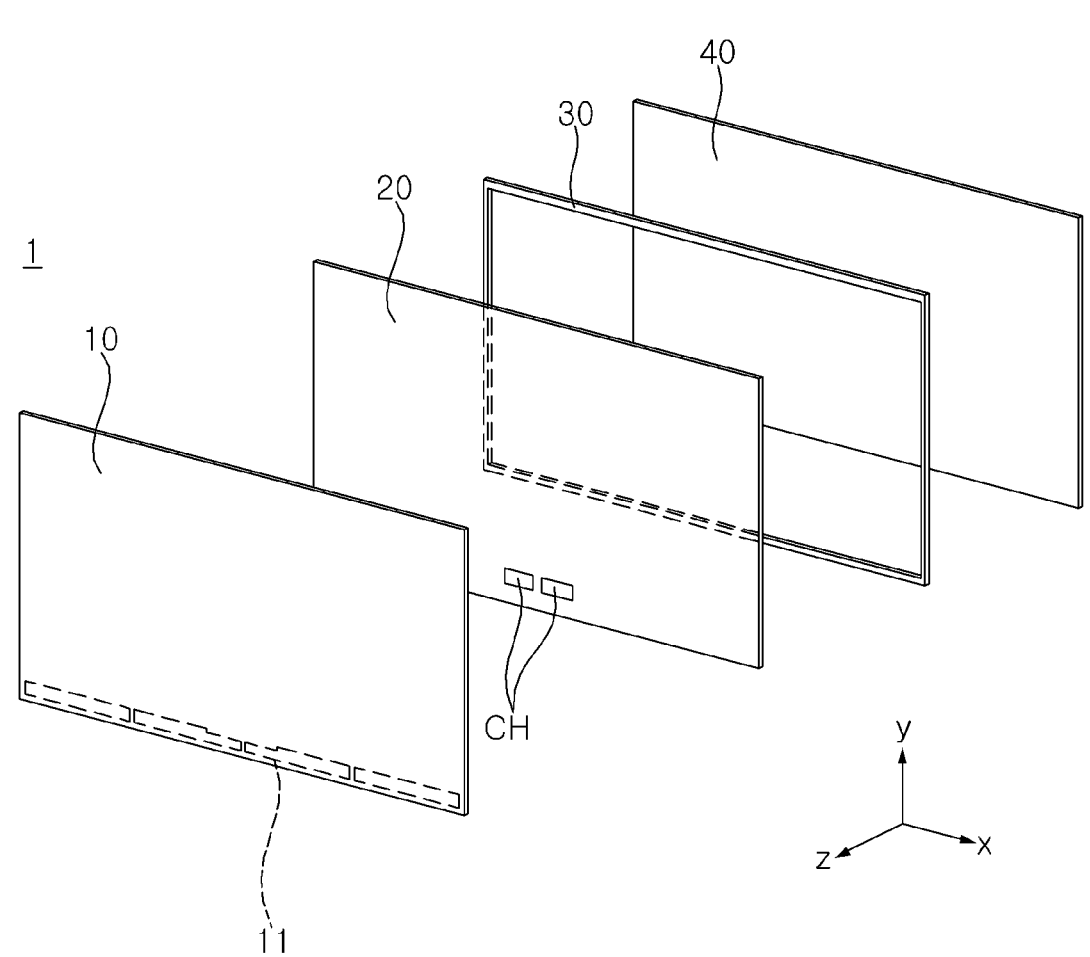

[FIG. 3]
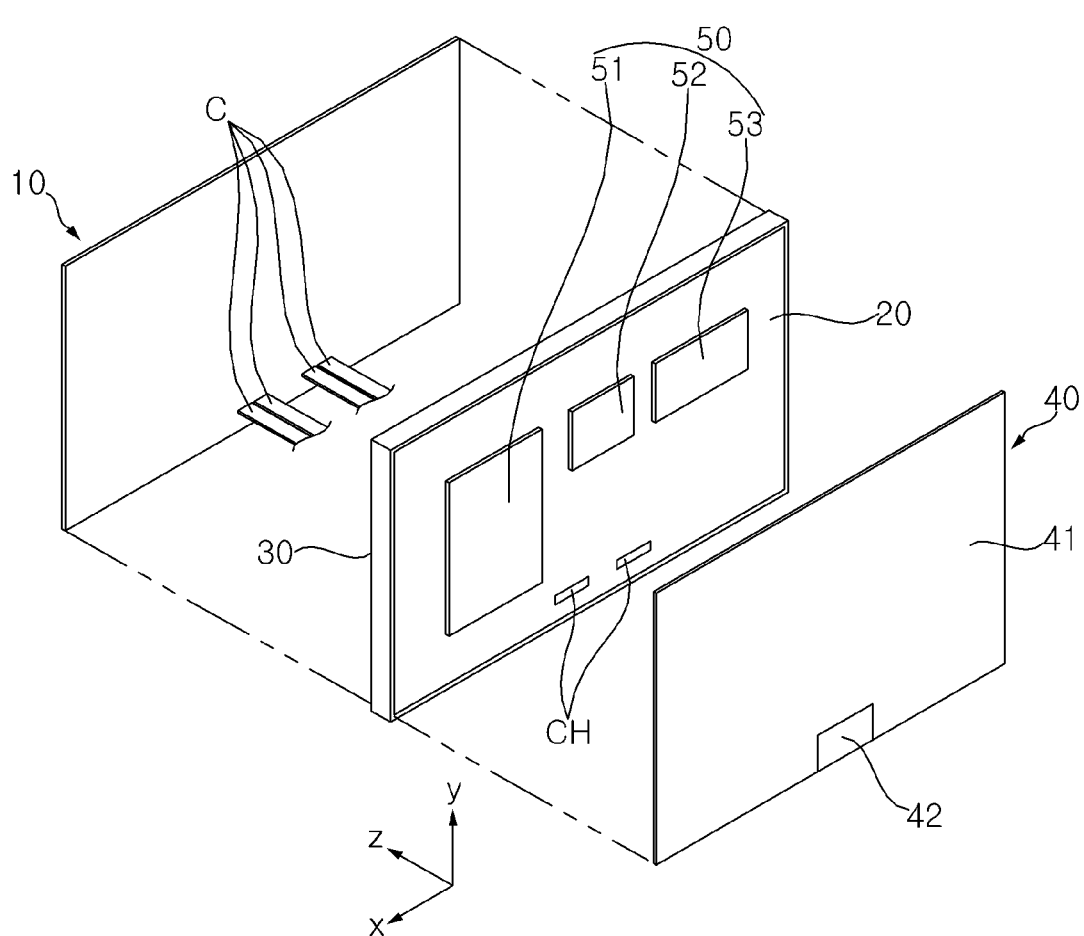

[FIG. 4]
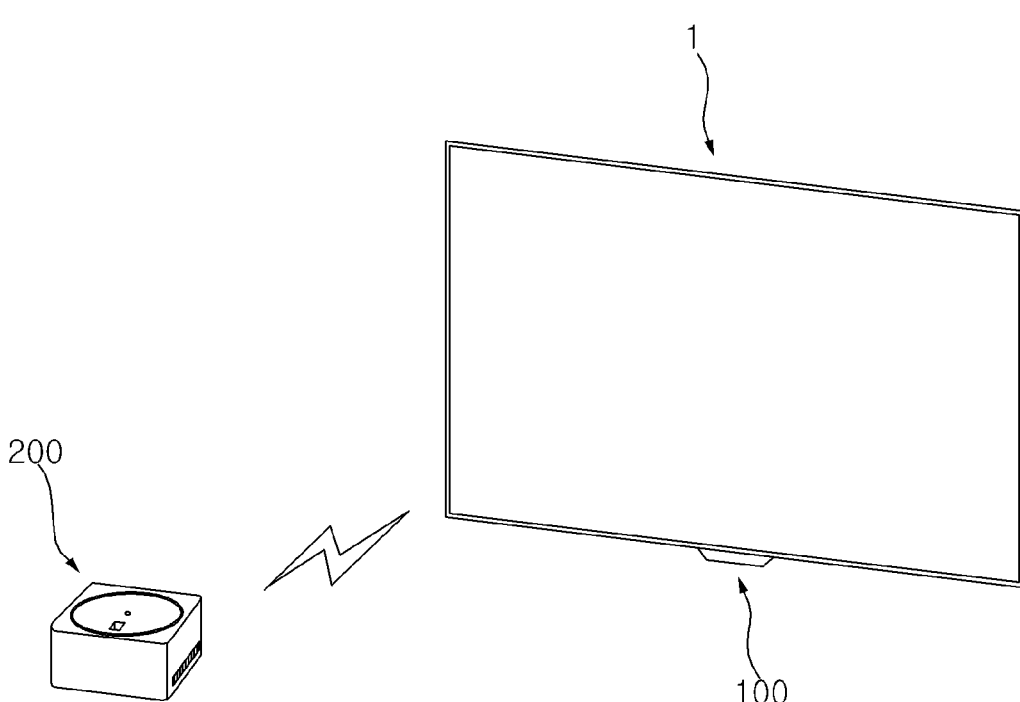

[FIG. 5]
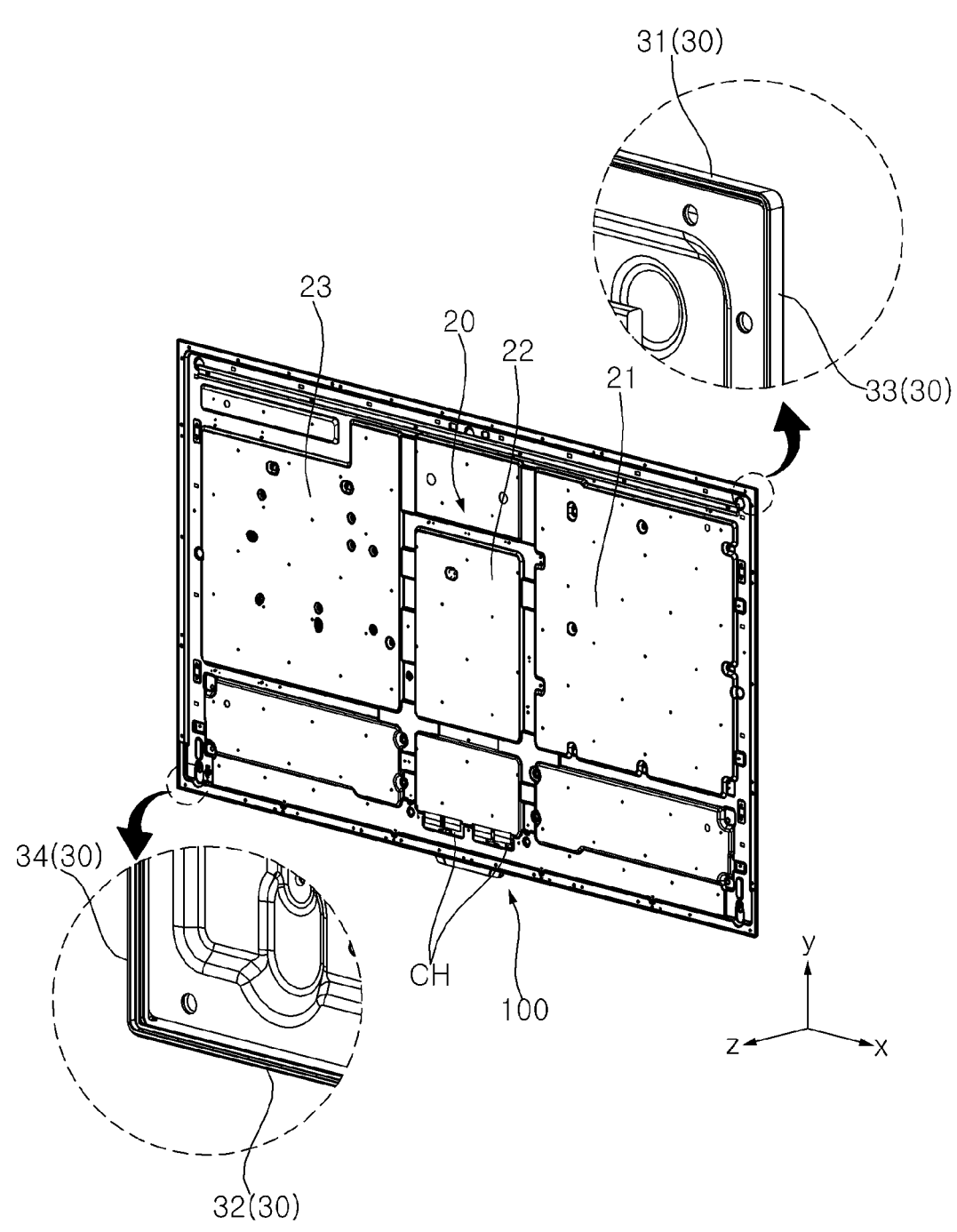

[FIG. 6]
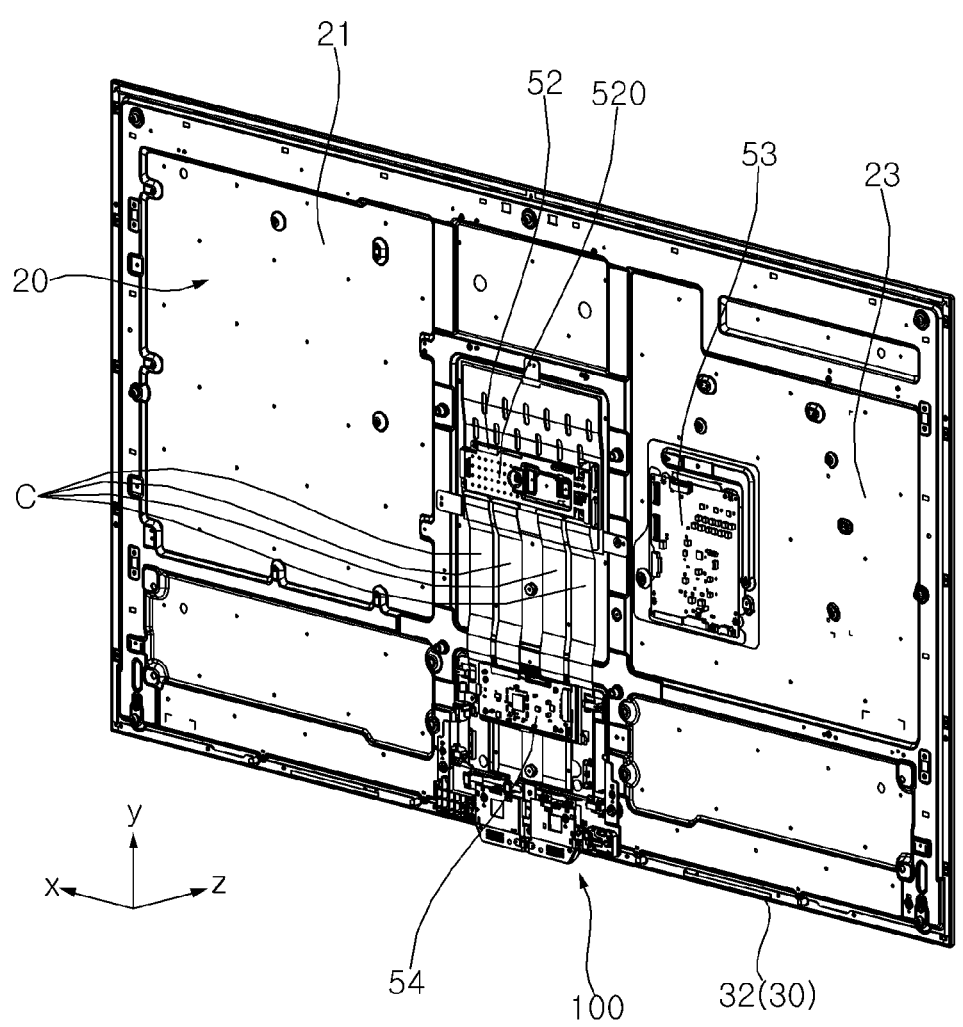

[FIG. 7]
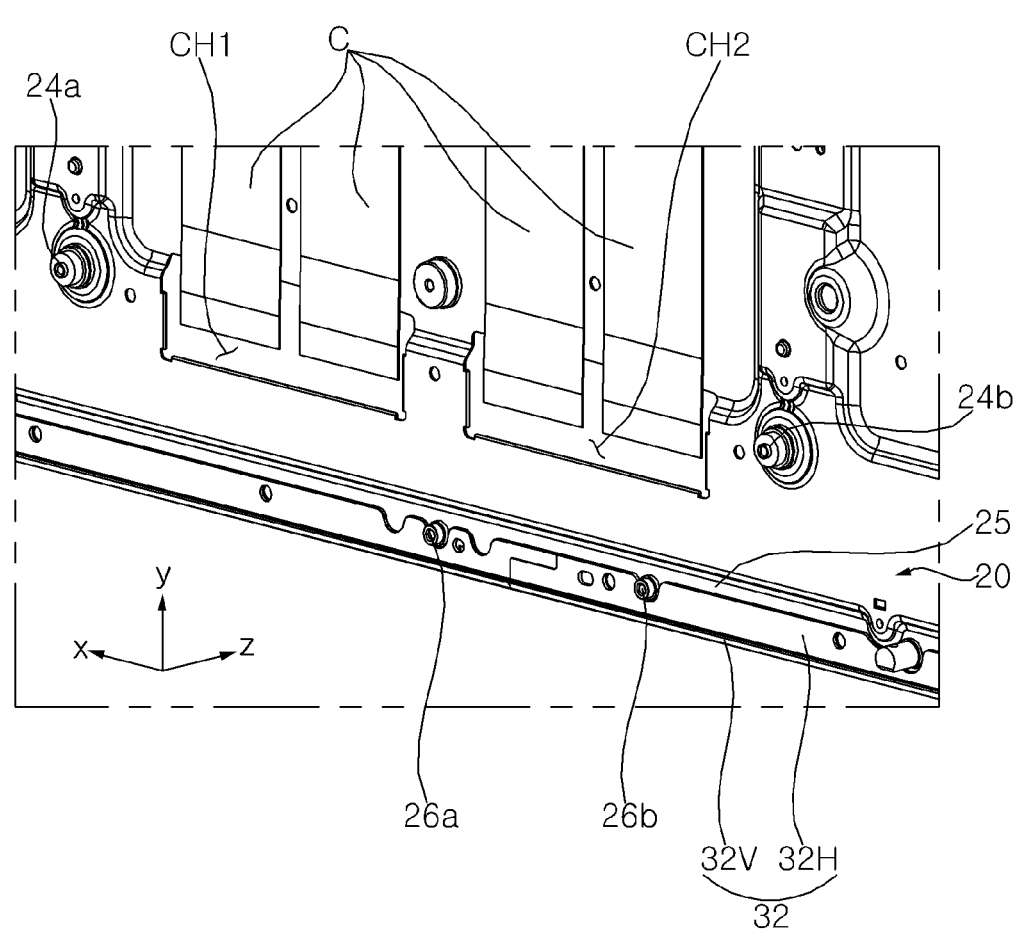

[FIG. 8]
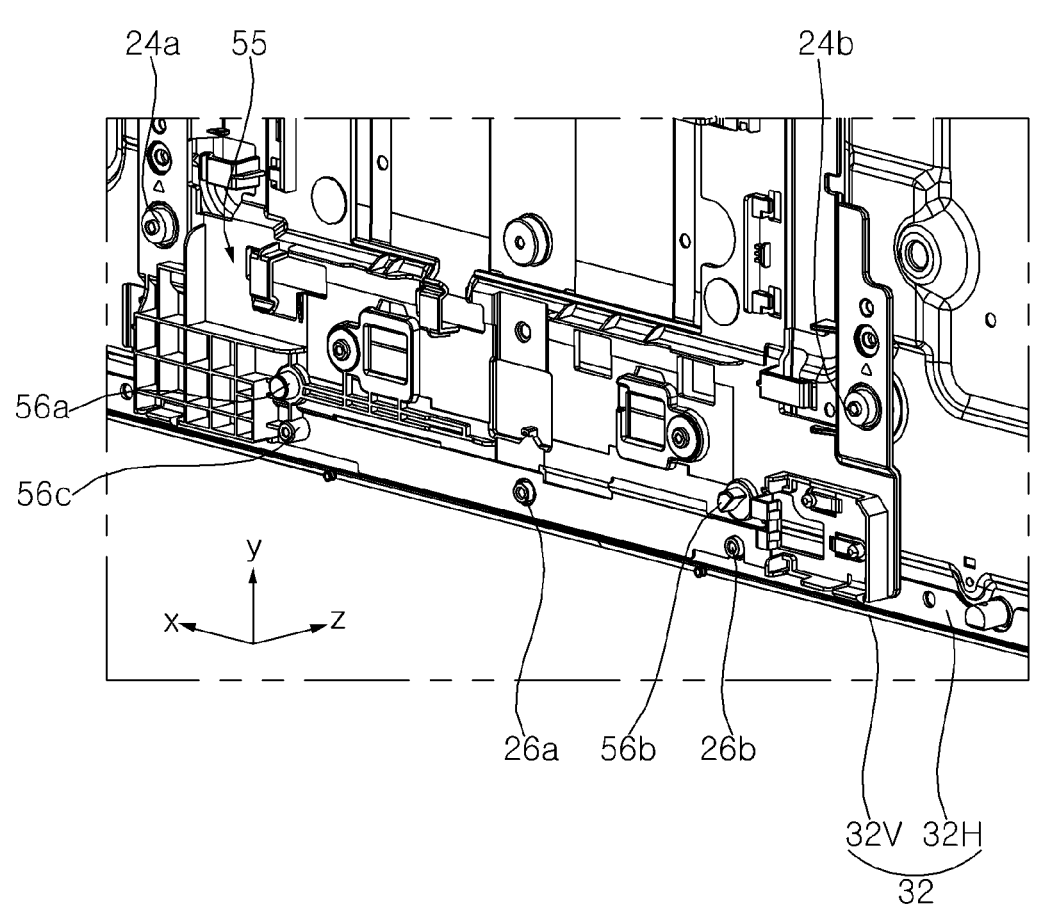

[FIG. 9]
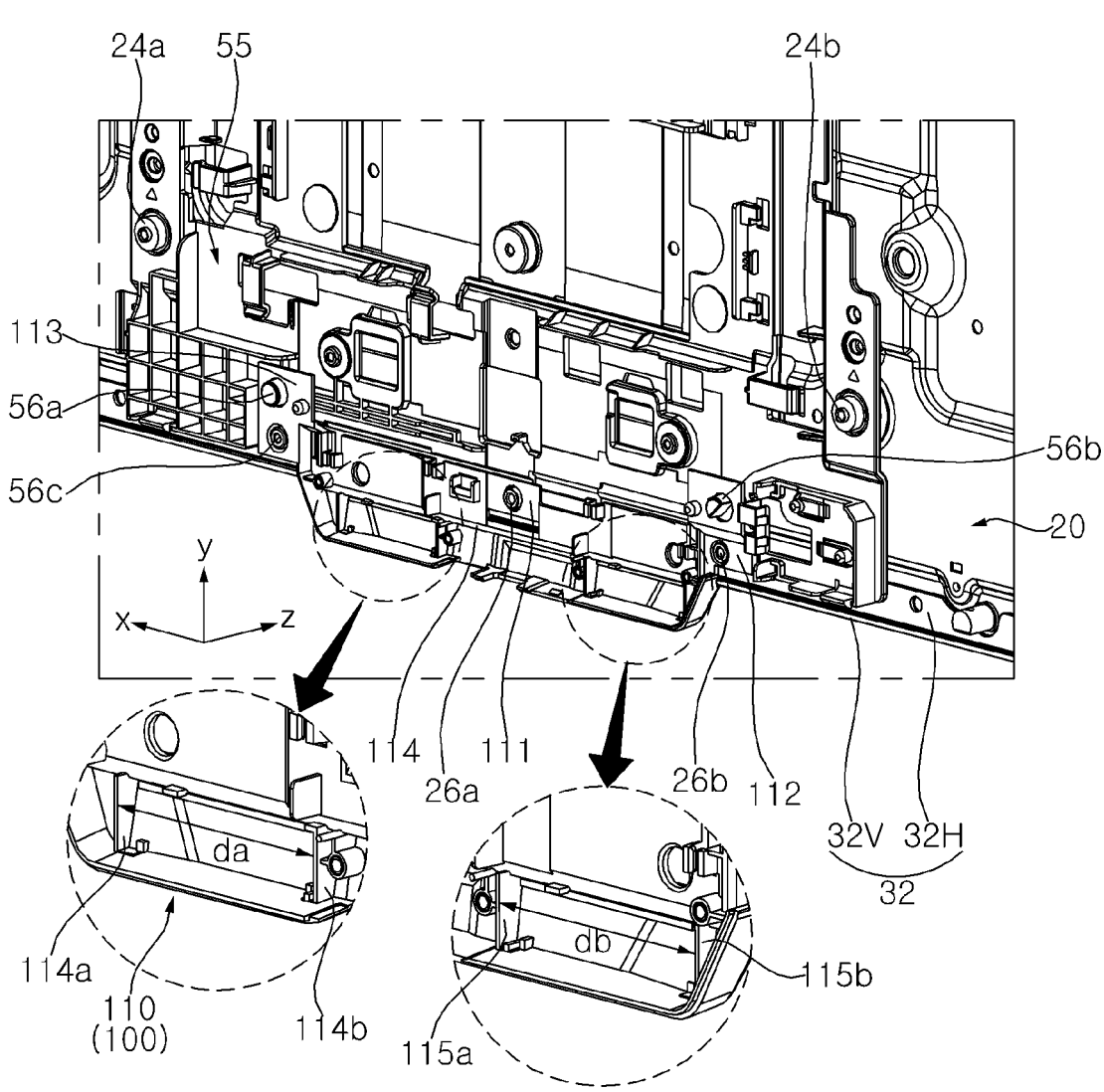

[FIG. 10]
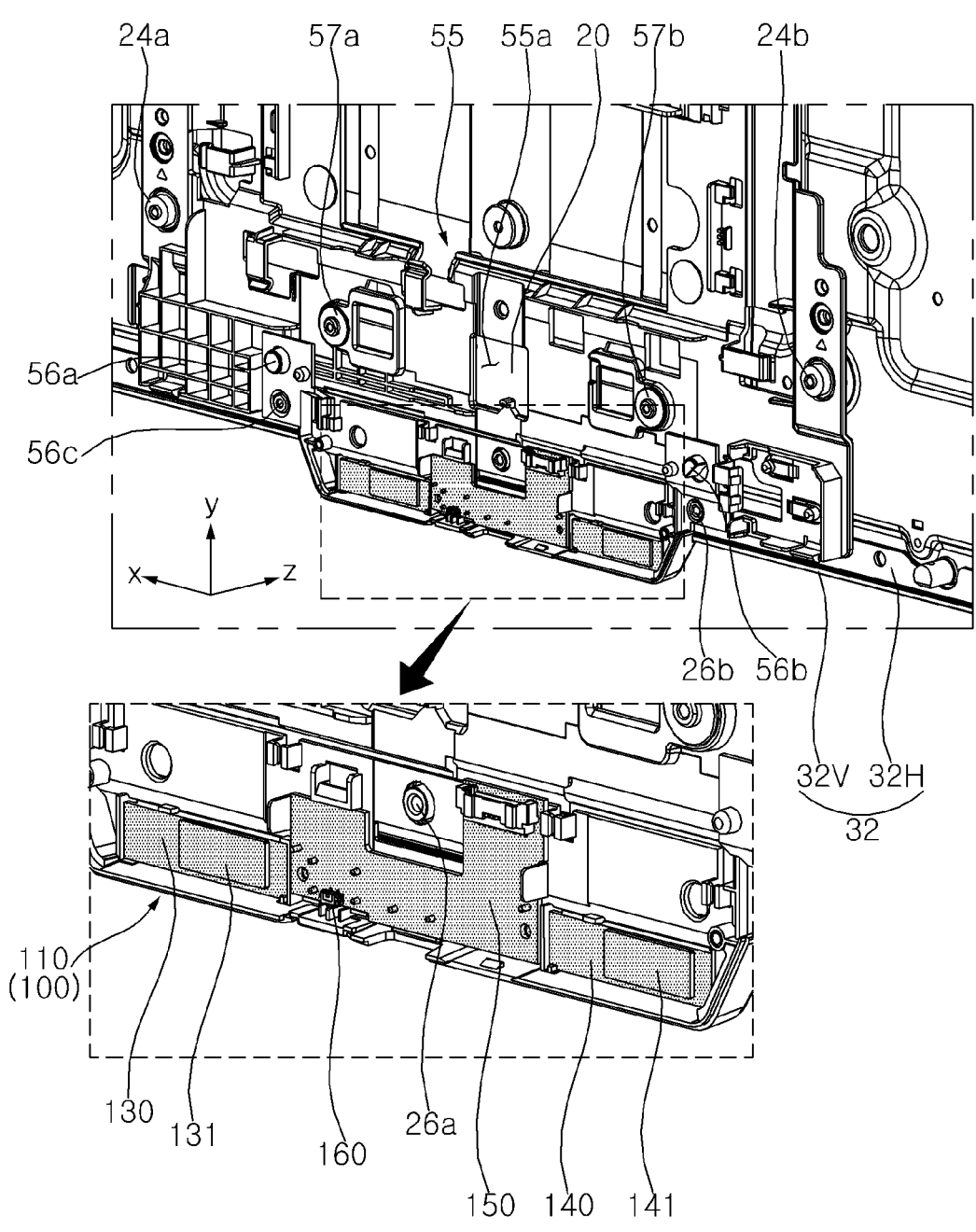

[FIG. 11]
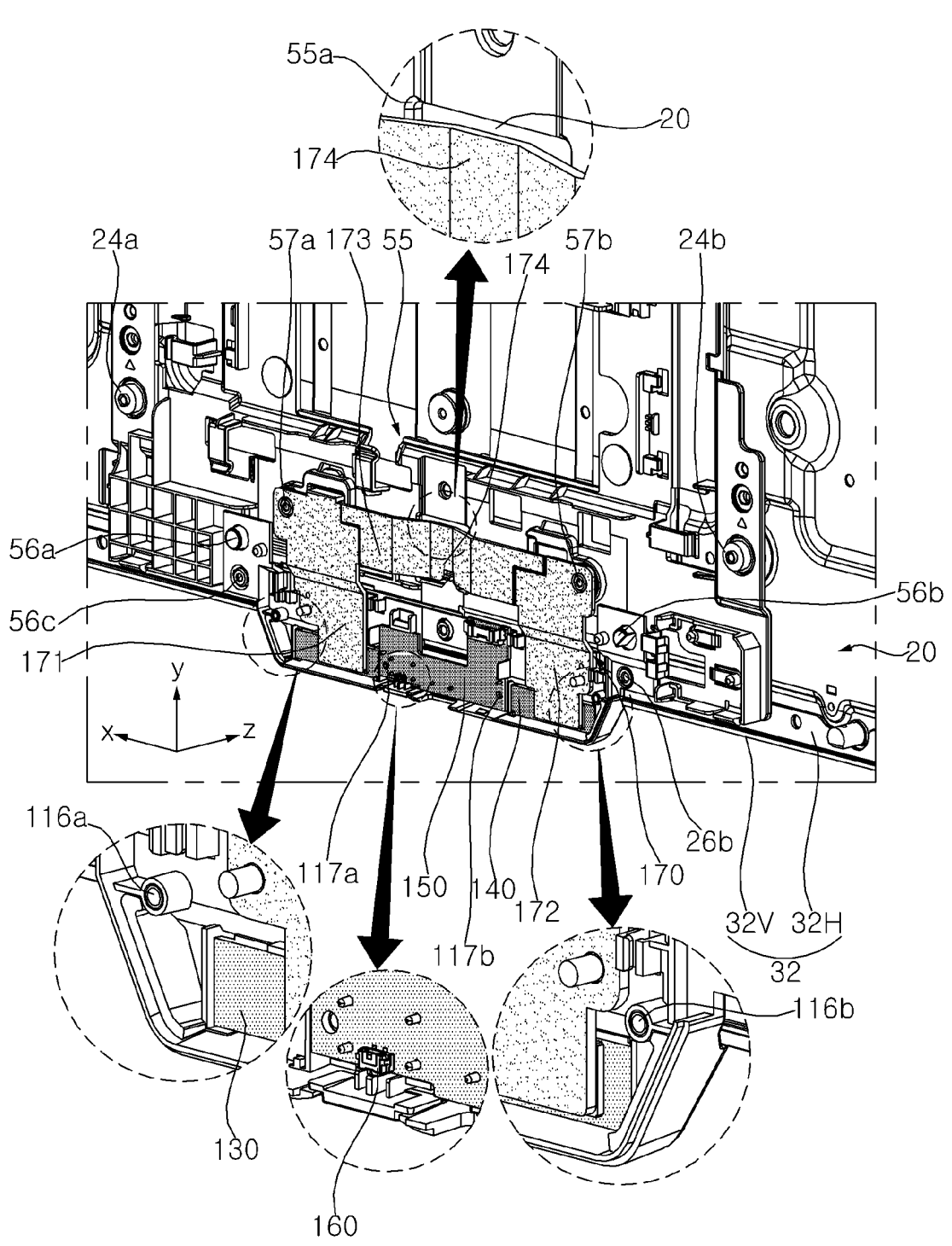

[FIG. 12]
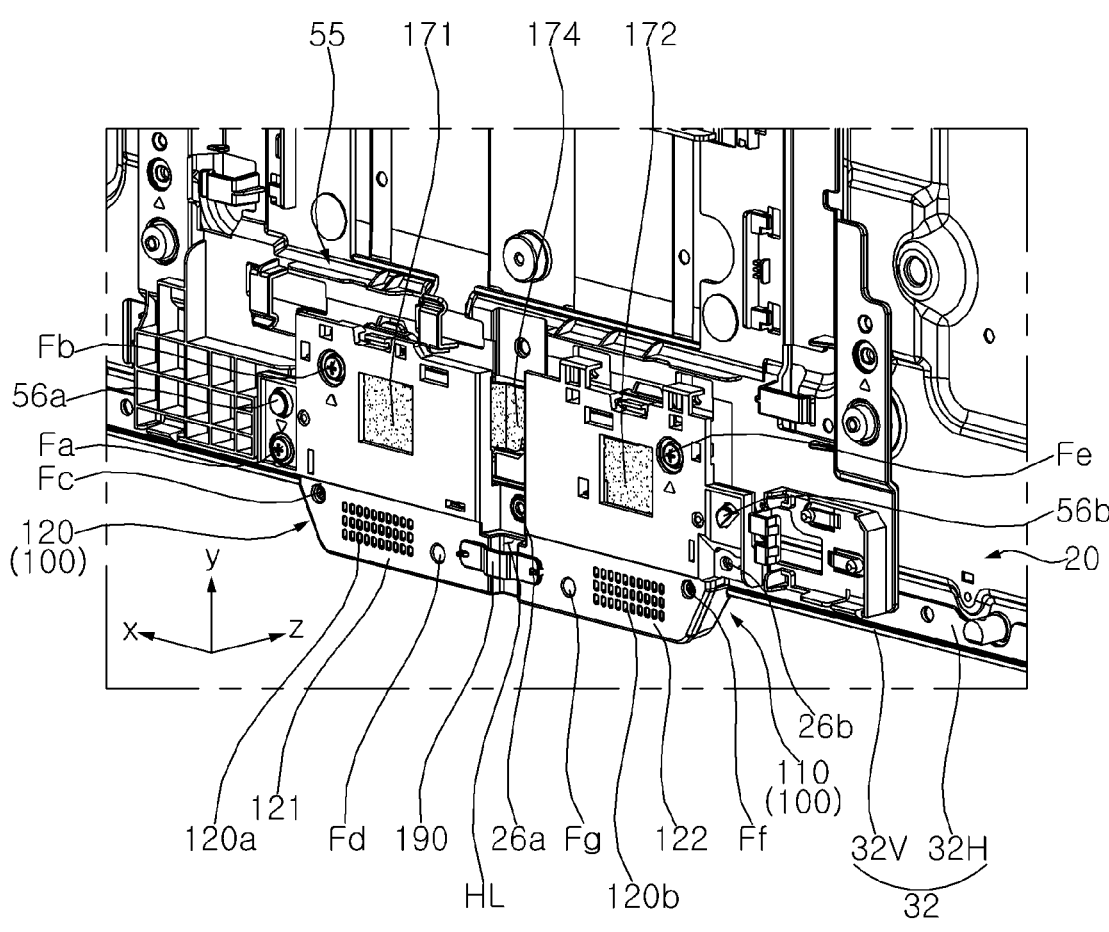

[FIG. 13]
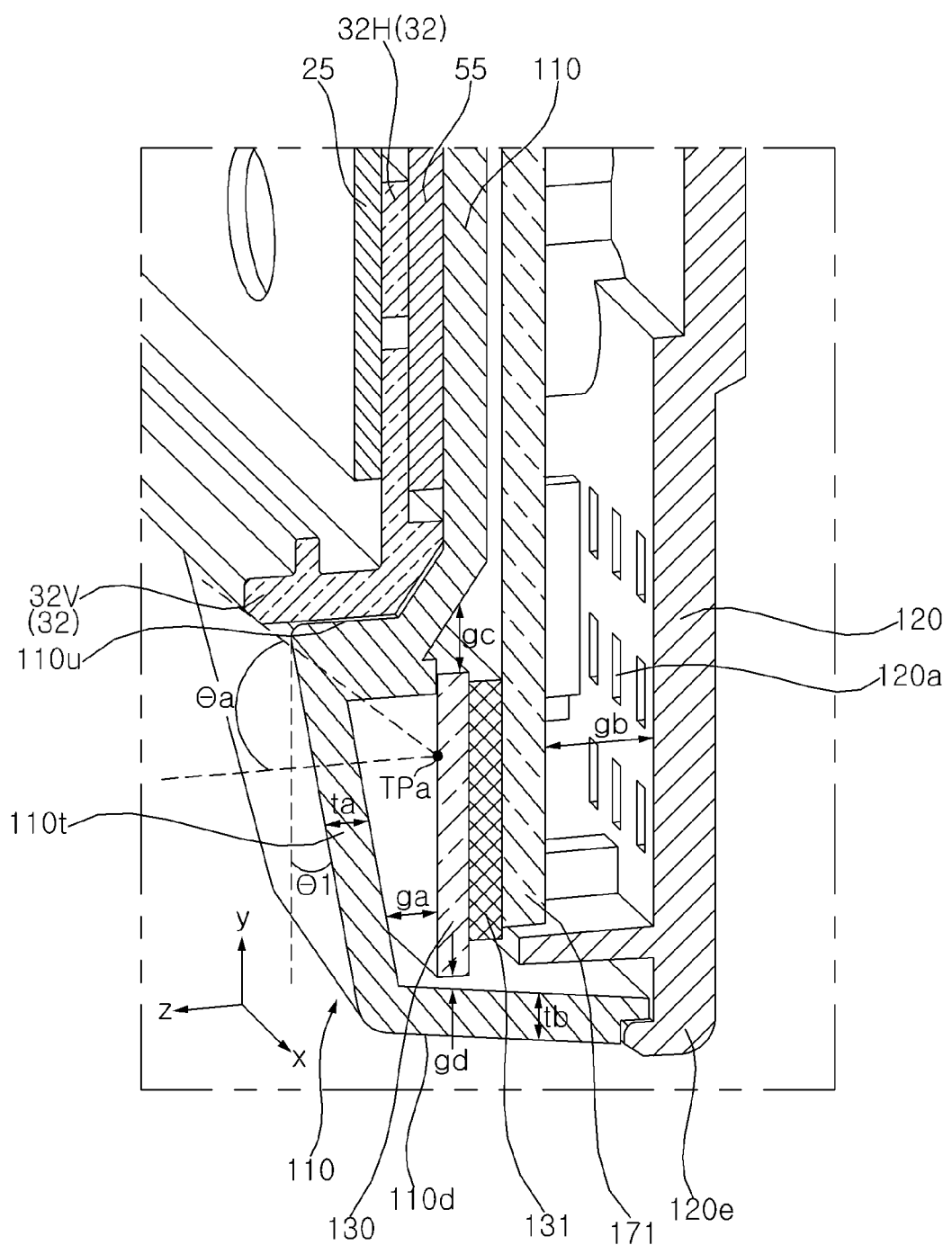

[FIG. 14]
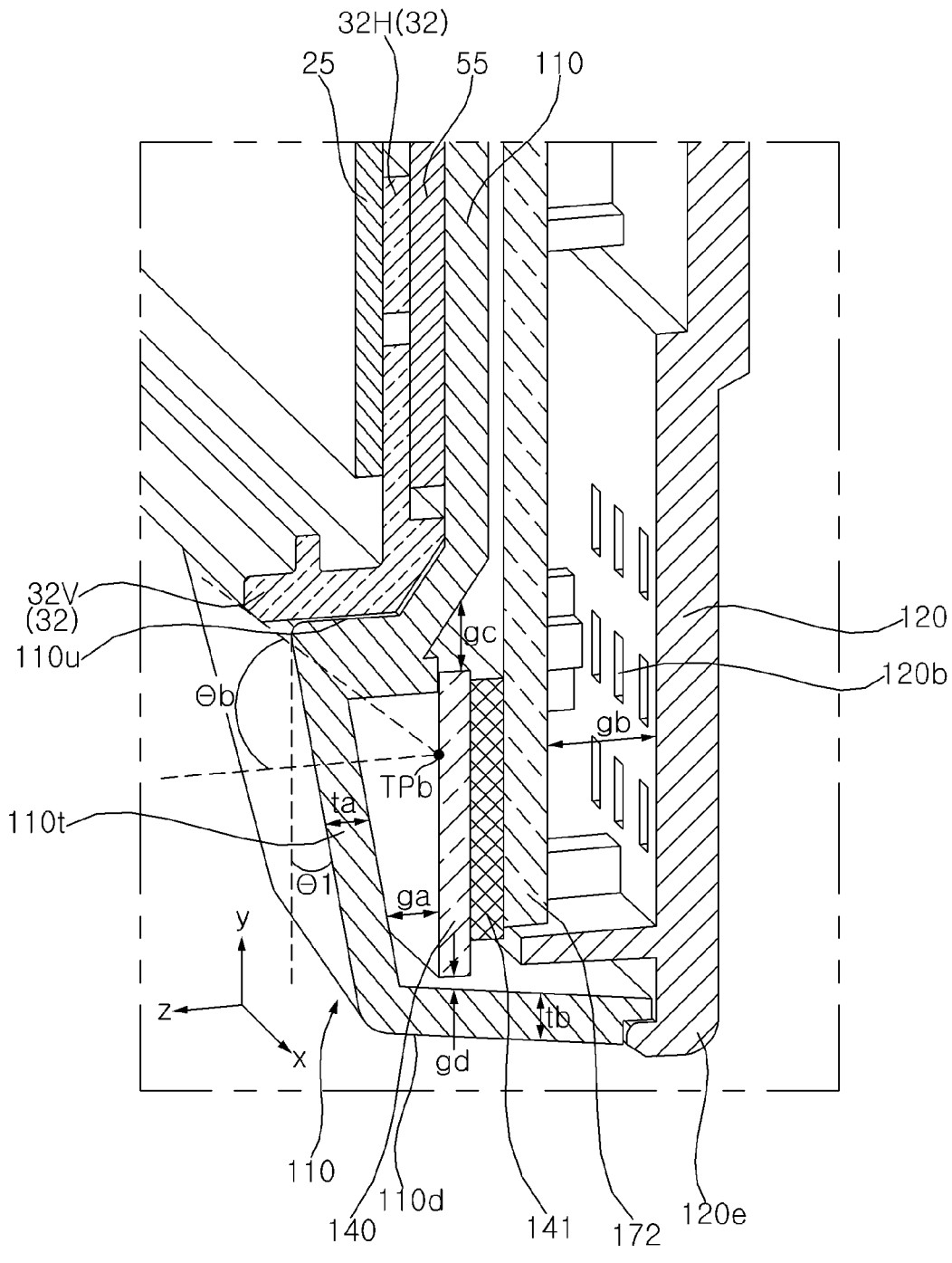

[FIG. 15]
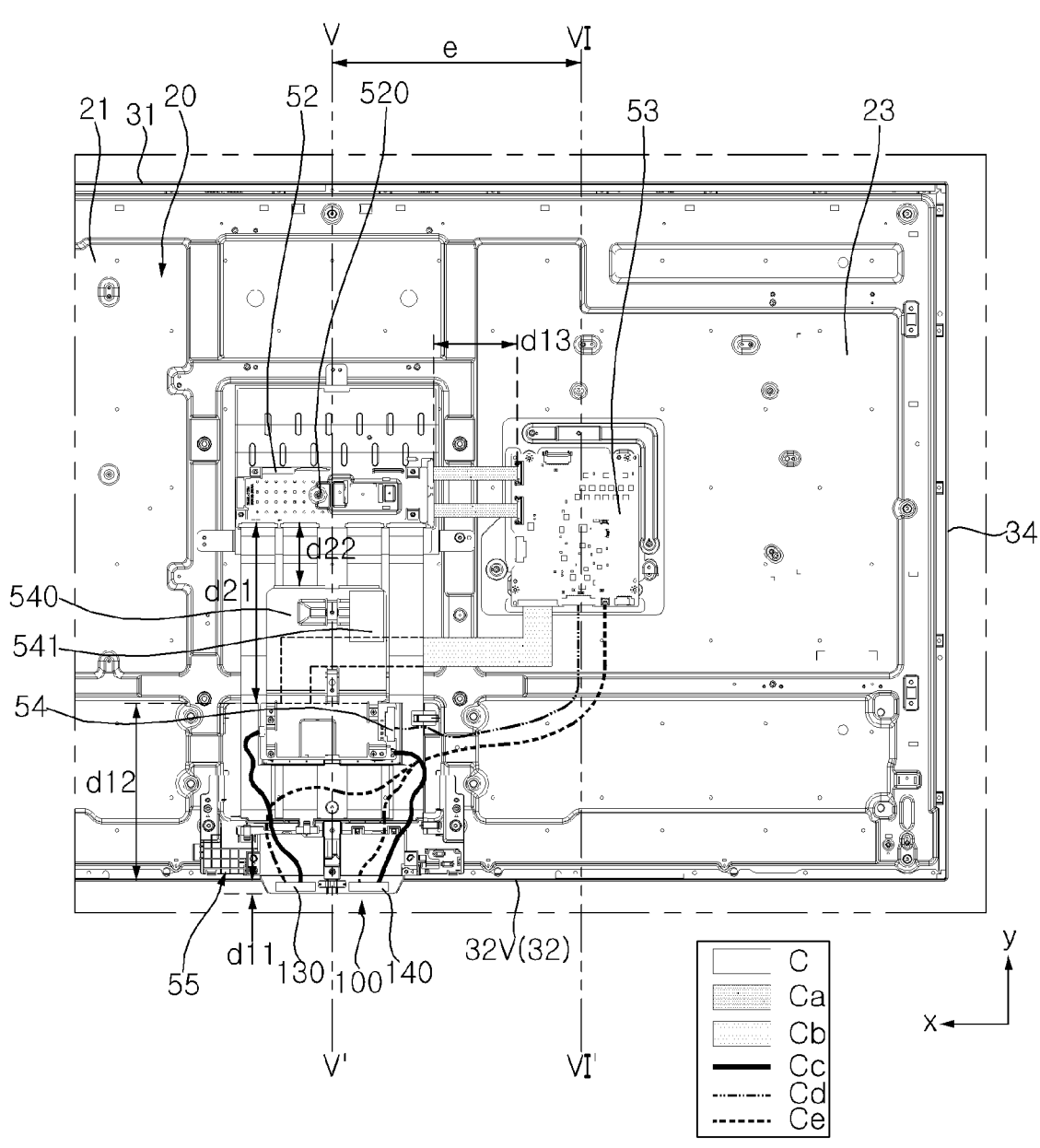

DISPLAY DEVICE

CROSS-REFERENCE TO RELATED APPLICATION(S)

This application is the National Stage filing under 35 U.S.C. 371 of International Application No. PCT/KR2021/008840, filed on Jul. 9, 2021, the contents of which is hereby incorporated by reference herein in its entirety.

TECHNICAL FIELD

The present disclosure relates to a display device.

BACKGROUND ART

As information society develops, the demand for display devices is also increasing in various forms. In response to this, various display devices such as Liquid Crystal Display Device (LCD), Organic Light Emitting Diode (OLED), and Micro LED have been researched and used in recent years.

Among these, a liquid crystal panel includes a TFT substrate and a color filter substrate that face each other with a liquid crystal layer interposed therebetween, and may display an image by using light provided from a backlight unit. In addition, an OLED panel may display an image by depositing an organic material layer capable of self-emitting light on a substrate on which a transparent electrode is formed. In particular, a display device equipped with OLED panel has an advantage of being implemented in an ultra-thin type as it does not require a backlight unit.

A control box may be used to be spaced from the display device, and adjacent to a user. The control box may provide various information to the display device. For example, the control box may be an AV box. The control box may exchange information in a wired/wireless manner with a display head equipped with a display panel that displays images.

Recently, much research has been achieved on the connectivity of such a display device.

DISCLOSURE OF INVENTION

Technical Problem

An object of the present disclosure is to solve the above-described problems and other problems.

Another object may be to provide a display device having a wireless communication module.

Another object may be to provide a display device that can minimize data loss due to an RF cable connected to a communication module.

Another object may be to provide a display device that can minimize performance degradation of a T-CON board due to heat.

Another object may be to provide a display device that can improve the reception rate of an antenna of communication module.

Another object may be to provide a display device that can minimize beam distortion of an antenna of communication module.

Solution to Problem

According to an aspect of the present disclosure, there is provided a display device including: a display panel; a frame which is positioned behind the display panel and to which the display panel is coupled; a communication module protruding from one side of the frame to the outside of the frame and including an antenna unit; and a first board coupled to the frame and electrically connected to the communication module, wherein the first board is disposed closer to the one side than the other side of the frame opposite to the one side.

Advantageous Effects of Invention

The effects of the display device according to the present disclosure will be described as follows.

According to at least one of the embodiments of the present disclosure, a display device having a wireless communication module may be provided.

According to at least one of the embodiments of the present disclosure, a display device capable of minimizing data loss due to an RF cable connected to a communication module may be provided.

According to at least one of the embodiments of the present disclosure, a display device that can minimize performance degradation of a T-CON board due to heat may be provided.

According to at least one of the embodiments of the present disclosure, a display device capable of improving the reception rate of an antenna of communication module may be provided.

According to at least one of the embodiments of the present disclosure, a display device capable of minimizing beam distortion of an antenna of communication module may be provided.

Further scope of applicability of the present disclosure will become apparent from the following detailed description. However, it should be understood that the detailed description and specific embodiments such as preferred embodiments of the present disclosure are given by way of illustration only, since various changes and modifications within the spirit and scope of the present disclosure may be clearly understood by those skilled in the art.

BRIEF DESCRIPTION OF DRAWINGS

FIGS. 1 to 15 are diagrams illustrating examples of a display device according to embodiments of the present disclosure.

MODE FOR INVENTION

Description will now be given in detail according to exemplary embodiments disclosed herein, with reference to the accompanying drawings. For the sake of brief description with reference to the drawings, the same or equivalent components may be denoted by the same reference numbers, and description thereof will not be repeated.

In general, suffixes such as "module" and "unit" may be used to refer to elements or components. Use of such suffixes herein is merely intended to facilitate description of the specification, and the suffixes do not have any special meaning or function.

In the present disclosure, that which is well known to one of ordinary skill in the relevant art has generally been omitted for the sake of brevity. The accompanying drawings are used to assist in easy understanding of various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are only used to distinguish one element from another.

It will be understood that when an element is referred to as being "connected with" another element, there may be intervening elements present. In contrast, it will be understood that when an element is referred to as being "directly connected with" another element, there are no intervening elements present.

A singular representation may include a plural representation unless context clearly indicates otherwise.

In the present application, it should be understood that the terms "comprises, includes," "has," etc. specify the presence of features, numbers, steps, operations, elements, components, or combinations thereof described in the specification, but do not preclude the presence or addition of one or more other features, numbers, steps, operations, elements, components, or combinations thereof.

Direction indications of up (U), down (D), left (Le), right (Ri), front (F), and rear (R) shown in the drawings are only for convenience of explanation, and the technical concept disclosed in this specification is not limited thereto.

Referring to FIG. 1, a display device 1 may include a display panel 10. The display panel 10 may display a screen.

The display device 1 may include a first long side LS1, a second long side LS2 opposite to the first long side LS1, a first short side SS1 adjacent to the first and second long sides LS1 and LS2, and a second short side SS2 opposite to the first short side SS1. Meanwhile, for convenience of description, it is illustrated that the lengths of the first and second long sides LS1 and LS2 are longer than the lengths of the first and second short sides SS1 and SS2, but it may also be possible that the lengths of the first and second long sides LS1 and LS2 are substantially equal to the lengths of the first and second short sides SS1 and SS2.

The direction parallel to the long sides LS1 and LS2 of the display device 1 may be referred to as a left-right direction or a first direction DR1. The direction parallel to the short sides SS1 and SS2 of the display device 1 may be referred to as an up-down direction or a second direction DR2. The direction perpendicular to the long sides LS1 and LS2 and the short sides SS1 and SS2 of the display device 1 may be referred to as a front-rear direction or a third direction DR3.

The direction in which the display panel 10 displays images may be referred to as a forward direction (F, z), and the opposite direction may be referred to as a rearward direction R. A side of the first long side LS1 may be referred to as an upper side (U, y). A side of the second long side LS2 may be referred to as a lower side D. A side of the first short side SS1 may be referred to as a left side (Le, x). A side of the second short side SS2 may be referred to as a right side Ri.

The first long side LS1, the second long side LS2, the first short side SS1, and the second short side SS2 may be referred to as an edge of the display device 1. In addition, a point where the first long side LS1, the second long side LS2, the first short side SS1, and the second short side SS2 meet each other may be referred to as a corner.

For example, a point where the first short side SS1 and the first long side LS1 meet may be referred to as a first corner C1. A point where the first long side LS1 and the second short side SS2 meet may be referred to as a second corner C2. A point where the second short side SS2 and the second long side LS2 meet may be referred to as a third corner C3. A point where the second long side LS2 and the first short side SS1 meet may be referred to as a fourth corner C4.

Referring to FIGS. 1 and 2, the display device 1 may include a display panel 10, a frame 20, a side frame 30, and a back cover 40.

The display panel 10 may form the front surface of the display device 1, and display an image in a forward direction. For example, the display panel 10 may be an Organic Light Emitting Diode (OLED) panel. However, the display panel applicable to the present disclosure is not limited to the OLED panel. The display panel 10 may divide an image into a plurality of pixels and output an image with color, brightness, and saturation adjusted for each pixel. The display panel 10 may be divided into an active area where images are displayed and a de-active area where images are not displayed. The display panel 10 may generate light corresponding to the color of red, green, or blue according to a control signal.

The frame 20 may be located in a rear of the display panel 10, and the display panel 10 may be coupled to the frame 20. For example, the frame 20 may include a metal material. Meanwhile, the frame 20 may be referred to as a main frame or module cover.

The side frame 30 may extend along the perimeter of the frame 20. The frame 20 may be coupled to the side frame 30 in front of the side frame 30. The side frame 30 may cover the lateral surfaces of the display panel 10 and the frame 20. Meanwhile, the side frame 30 may be referred to as a guide panel.

The back cover 40 may be located in the rear of the frame 20, and may be coupled to the frame 20. For example, the back cover 40 may be an injection molded product made of resin. For another example, the back cover 40 may include a metal material.

Referring to FIG. 3, boards 50 may be mounted on the frame 20 at the rear of the frame 20. A plurality of electronic devices may be mounted on the boards 50. The board 50 may be a printed circuit board PCB, and may be electrically connected to electronic components of a display device.

For example, the boards 50 may include a power supply board 51 that provides power to each component of the display device, a timing controller board 52 that provides an image signal to the display panel 10, and a main board 53 that controls the display device. Meanwhile, the timing controller board 52 may be referred to as a T-CON board.

Meanwhile, a Source PCB (S-PCB) 11 (see FIG. 2) may be adjacent to the lower surface of the display panel 10, and may be coupled to the rear surface of the display panel 10. A cable C may pass through a cable hole CH formed in the lower portion of the frame 20, and may be electrically connected to the S-PCB 11 and the timing controller board 52. Accordingly, the cable C may transmit digital video data and timing control signals from the timing controller board 52 to the S-PCB 11. For example, the cable C may be a flexible flat cable FFC.

Referring to FIG. 4, the control box 200 may be spaced apart from the display device 1. The control box 200 may be referred to as a set-top box. The control box 200 may wirelessly exchange information with the display device 1. A communication module (not shown) of the control box 200 may communicate wirelessly with the communication module 100 of the display device 1. At least a portion of the communication module 100 may protrude outward from the edge of the display device 1. Accordingly, the communication module 100 may smoothly communicate wirelessly with the communication module of the control box 200.

The stability of wireless communication between the control box 200 and the display device 1 may vary depending on the relative positions of the control box 200 and the display device 1. The display device 1 may be located at a constant location in order to maintain a constant distance from a user. The control box 200 needs to have an enhanced degree of freedom in a place where it is located for user convenience.

Meanwhile, the control box 200 may be a component of the display device 1. In this case, the display device 1 may be referred to as a head 1.

Referring to FIG. 5, the side frame 30 may include a first part 31, a second part 32, a third part 33, and a fourth part 34. The first part 31 may extend along the upper side of the frame 20, and form a first long side LS1 (see FIG. 1). The third part 33 may be bent downward from the left end of the first part 31, may extend along the left side of the frame 20, and may form a first short side SS1 (see FIG. 1). The second part 32 may be bent to the right from the lower distal end of the third part 33, may extend along the lower side of the frame 20, and may form a second long side LS2 (see FIG. 1). The fourth part 34 may be bent upward from the right distal end of the second part 32, may extend along the right side of the frame 20, and may form a second short side SS2 (see FIG. 1).

A first forming part 21, a second forming part 22, and a third forming part 23 may be formed by pressing the frame 20 from the front surface to the rear. The first forming part 21 may be located close to the left side of the frame 20, the third forming part 23 may be located close to the right side of the frame 20, and the second forming part 22 may be located between the first forming part 21 and the third forming part 23. The power supply board 51 (see FIG. 3) may be mounted on the rear surface of the first forming part 21. The timing controller board 52 (see FIG. 3) may be mounted on the rear surface of the second forming part 22. The main board 53 (see FIG. 3) may be mounted on the rear surface of the third forming part 23.

Referring to FIG. 6, a shield plate 520 may be mounted on the rear surface of the timing controller board 52. A first board 54 may be spaced downward from the timing controller board 52, and may be mounted on the rear surface of the frame 20. The second board 53 may be spaced to the right from the timing controller board 52, and may be mounted on the rear surface of the frame 20. A shield plate (not shown) may be mounted on the rear surface of each of the first board 54 and the second board 53. The communication module 100 may receive compressed sound and/or video data from the communication module of the control box 200 (see FIG. 4). The first board 54 may decompress the sound and/or video data received from the communication module 100, convert it, and provide it to the second board 53. The second board 53 may provide data received from the first board 54 to the display panel 10 (see FIG. 3) through the timing controller board 52. In addition, the second board 53 may provide the data received from the first board 54 to a speaker (not shown) that is electrically connected to the second board 53 through a cable or the like and provided in the display device. The first board 54 may be referred to as an RF receiving device, an RF processing device, or a wireless audio video (WAV) board. The second board 53 may be referred to as an amplifier (AMP) board. For example, the second board 53 may be a main board 53.

Referring to FIG. 7, a first cable hole CH1 and a second cable hole CH2 may be formed to penetrate the frame 20 in the front-rear direction, and may be adjacent to the second part 32. The first cable hole CH1 may be adjacent to, but may be spaced apart from, the second cable hole CH2. For example, four cables C may form a pair by using every two cables, one pair may pass through the first cable hole CH1, and the other pair may pass through the second cable hole CH2.

The second part 32 may include a vertical portion 32V and a horizontal portion 32H.

The vertical portion 32V may extend along the lower side of the frame 20, and may form the lower side of the second part 32. The vertical portion 32V may have a width in a direction intersecting the frame 20. In other words, the length of the vertical portion 32V may be defined in the left-right direction, the width of the vertical portion 32V may be defined in the front-rear direction, and the thickness of the vertical portion 32V may be defined in the up-down direction.

The horizontal portion 32H may protrude from the upper side of the frame 20 toward the rear of the frame 20. The horizontal portion 32H may be disposed parallel to the frame 20 at the rear of the frame 20. In other words, the length of the horizontal portion 32H may be defined in the left-right direction, the width of the horizontal portion 32H may be defined in the up-down direction, and the thickness of the horizontal portion 32H may be defined in the front-rear direction.

Meanwhile, a pressing portion 25 may be formed by pressing toward from the rear surface of the frame 20, and may form the lower side of the frame 20. The front surface of the pressing portion 25 may contact the rear surface of the horizontal portion 32H. The horizontal portion 32H may be coupled to or fixed to the pressing portion 25.

A lower fixing portion 26a, 26b may protrude from the pressing portion 25 toward the horizontal portion 32H, and may penetrate the horizontal portion 32H. A first lower fixing portion 26a may be spaced to the left from a second lower fixing portion 26b. An upper fixing portion 24a, 24b may protrude rearward from the frame 20. A first upper fixing portion 24a may be adjacent to the first cable hole CH1, and a second upper fixing portion 24b may be adjacent to the second cable hole CH2.

For example, the lower fixing portion 26a, 26b and the upper fixing portion 24a, 24b may be a pemnut.

Referring to FIG. 8, a base 55 may be detachably coupled to the frame 20 and the second part 32 at the rear of the frame 20. The base 55 may be located above the vertical portion 32V. A portion of the base 55 may cover at least a portion of the rear of the cable hole CH1, CH2 (see FIG. 7). A portion of the base 55 may cover a portion of the rear surface of the horizontal portion 32H. The lower fixing portion 26a, 26b and the upper fixing portion 24a, 24b may penetrate the base 55.

A boss 56a, 56b, and the third lower fixing portion 56c may protrude rearward from the base 55. The third lower fixing portion 56c may be adjacent to the vertical portion 32V, and may be opposite to the horizontal portion 32H with respect to the base 55. The third lower fixing portion 56c may be opposite to the second lower fixing portion 26b with respect to the first lower fixing portion 26a. The first boss 56a may be adjacent to the third lower fixing portion 56c, but may be spaced upward from it. The second boss 56b may be adjacent to the second lower fixing portion 26b, but may be spaced upward from it. For example, the third lower fixing portion 56c may be a pemnut. Meanwhile, the boss 56a, 56b may be referred to as a fixing pin.

Referring to FIG. 9, a front housing 110 may be detachably coupled to the base 55 at the rear of the base 55. A first portion, which is a portion of the front housing 110, may be located above the vertical portion 32V, and a second portion, which is the remaining portion of the front housing 110, may be located below the vertical portion 32V. The first portion may form the front surface of the communication module 100. The first portion and the second portion may be formed as one body.

The first portion may include a first coupling portion 111, a second coupling portion 112, and a third coupling portion 113. The first coupling portion 111 may be located approximately in the center of the first portion, and the third coupling portion 113 may be opposite to the second coupling portion 112 with respect to the first coupling portion 111. The first lower fixing portion 26a may penetrate the first coupling portion 111. The second lower fixing portion 26b may penetrate the second coupling portion 112. The third lower fixing portion 56c may penetrate the third coupling portion 113.

The second portion may include a pair of left ribs 114a and 114b and a pair of right ribs 115a and 115b provided inside the second portion. The pair of left ribs 114a and 114b and the pair of right ribs 115a and 115b may be spaced apart from each other in the left-right direction, and may be disposed vertically inside the second portion. A partition wall 114 may be located at the boundary between the first portion and the second portion, and may extend in the left-right direction to contact or be adjacent to the inside of the front housing 110. In this case, the pair of left ribs 114a and 114b and the pair of right ribs 115a and 115b may be coupled to the lower side of the partition wall 114. A first left rib 114a may be adjacent to the left side of the second portion, and a second left rib 114b may be spaced to the right by a first distance da from the first left rib 114a. The first right rib 115a may be opposite to the first left rib 114a with respect to the second left rib 114b. The second right rib 115b may be spaced to the right by a second distance db from the first right rib 115a, and may be adjacent to the right side of the second portion.

For example, the first distance da may be substantially equal to the second distance db. For another example, the first distance da may be smaller or larger than the second distance db.

Referring to FIGS. 9 and 10, the communication module 100 may include an antenna unit 130, 140. The number of antenna unit 130, 140 may be one or two or more. A first antenna unit 130 may be disposed between a pair of left ribs 114a and 114b. A first pad 131 may be coupled or attached to the rear surface of the first antenna unit 130. The first pad 131 may include a material having an excellent thermal conductivity, and may be referred to as a thermal pad. A second antenna unit 140 may be disposed between a pair of right ribs 115a and 115b. A second pad 141 may be coupled or attached to the rear surface of the second antenna unit 140. The second pad 141 may include a material having an excellent thermal conductivity, and may be referred to as a thermal pad. Meanwhile, the first antenna unit 130 may be referred to as a left antenna unit, and the second antenna unit 140 may be referred to as a right antenna unit.

For example, a patch antenna may be provided on the front surface of each of the first antenna unit 130 and the second antenna unit 140. For example, an array antenna using a dipole antenna or a monopole antenna may be provided on the left and lower side surfaces of the first antenna unit 130. For example, an array antenna using a dipole antenna or a monopole antenna may be provided on the right and lower side surfaces of the second antenna unit 140. The array antenna may have an end-fire shape.

For example, the first antenna unit 130 and the second antenna unit 140 may have a different polarization characteristic. For example, the first antenna unit 130 may have a vertical polarization characteristic. For example, the second antenna unit 140 may have a horizontal polarization characteristic. Here, polarization refers to a polarity direction of an electric field with respect to the direction of electromagnetic wave from the antenna.

An Infrared (IR) module 150 may be disposed between the second left rib 114b and the first right rib 115a. The IR module 150 may include a controller. An input unit 160 may be adjacent to the lower side of the IR module 150. The input unit 160 may be exposed to the lower side of the front housing 110. Meanwhile, the input unit 160 may be referred to as a power unit or button.

Referring to FIGS. 10 and 11, a plate fixing portion 57a, 57b may protrude rearward from the base 55, and may be located above the front housing 110. A first plate fixing portion 57a and a second plate fixing portion 57b may be spaced apart from each other in the left-right direction. For example, the plate fixing portion 57a, 57b may be a pemnut.

The plate 170 may be detachably coupled to the base 55 and the front housing 110 at the rear of the base 55 and the front housing 110. The plate 170 may cover a portion of the rear of the base 55 and a portion of the rear of the front housing 110. The plate fixing portion 57a, 57b may penetrate the plate 170. The plate 170 may include a material having an excellent thermal conductivity, and may be referred to as a heat sink. The plate 170 may have an overall square bracket shape, and may include a first plate 171, a second plate 172, and a third plate 173.

The first plate 171 may be located at a rear of the first antenna unit 130, and may extend long in the up-down direction. For example, the first plate 171 may be bent at least once, and an imaginary horizontal plane (i.e., an XY plane) on which an upper portion of the first plate 171 is located may be located at a rear of an imaginary horizontal plane (i.e., an XY plane) on which a lower portion of the first plate 171 is located. The rear surface of the first pad 131 may contact the lower portion of the first plate 171. That is, heat generated by the first antenna unit 130 may be transmitted to the lower portion of the first plate 171 through the first pad 131, and the heat may be transmitted from the lower portion of the first plate 171 to the upper portion of the first plate 171. Accordingly, heat of the first antenna unit 130 may be effectively removed.

The second plate 172 may be located at a rear of the second antenna unit 140, and may extend long in the up-down direction. For example, the second plate 172 may be bent at least once, the upper portion of the second plate 172 may be located on the horizontal plane where the upper portion of the first plate 171 is located, and the lower portion of the second plate 172 may be located on the horizontal plane where the lower portion of the first plate 171 is located. The rear surface of the second pad 141 may contact the lower portion of the second plate 172. That is, the heat generated by the second antenna unit 140 may be transmitted to the lower portion of the second plate 172 through the second pad 141, and may be transmitted from the lower portion of the second plate 172 to the lower portion. Accordingly, heat of the second antenna unit 140 may be effectively removed.

The third plate 173 may extend long between the upper portion of the first plate 171 and the upper portion of the second plate 172, and may be connected to the upper portion of the first plate 171 and the upper portion of the second plate 172. The third plate 173 may be located above the IR module 150. For example, the first plate 171, the second plate 172, and the third plate 173 may be formed separately, or may be coupled to each other. For another example, the first plate 171, the second plate 172, and the third plate 173 may be formed as one body.

For example, a press portion 174 may be formed by pressing the third plate 173 toward the frame 20, and may be located approximately in the center of the plate 170. A base hole 55a may be formed to penetrate the base 55 in the front-rear direction, and the press portion 174 may contact the rear surface of the frame 20 through the base hole 55a. That is, the heat of the third plate 173 may be easily transmitted to the frame 20. Accordingly, heat dissipation of the first antenna unit 130 and the second antenna unit 140 may be achieved more effectively.

Referring to FIGS. 11 and 12, a housing fixing portion 116a, 116b may protrude rearward from the inside of the front housing 110, and may be located on the partition wall 114. A first housing fixing portion 116a may be adjacent to the left side of the front housing 110, and a second housing fixing portion 116b may be adjacent to the right side of the front housing 110. For example, the housing fixing portion 116a, 116b may be a pemnut. A board pin 117a, 117b may protrude rearward from the IR module 150. A first board pin 117a may be adjacent to the left side of the IR module 150, and a second board pin 117b may be adjacent to the right side of the IR module 150.

A rear housing 120 may be detachably coupled to the base 55 and the front housing 110 at the rear of the plate 170. The rear housing 120 may form the rear surface of the communication module 100. For example, the rear surface of the communication module 100 may be located in front of the rear surface of the back cover 40 (see FIG. 17). The rear housing 120 may include a first housing 121 and a second housing 122.

The first housing 121 may be located at a rear of the first plate 171. A first opening (not denoted) may be formed to penetrate the first housing 121 in the front-rear direction, and may be located at the rear of the upper portion of the first plate 171. A first hole 120a may be formed to penetrate the first housing 121 in the front-rear direction, and may be located at the rear of the first antenna unit 130. Accordingly, the first antenna unit 130 may be cooled by air passing through the first hole 120a.

The second housing 122 may be located at a rear of the second plate 172. A second opening (not denoted) may be formed to penetrate the second housing 122 in the front-rear direction, and may be located at the rear of the upper portion of the second plate 172. A second hole 120b may be formed to penetrate the second housing 122 in the front-rear direction, and may be located at the rear of the second antenna unit 140. Accordingly, the second antenna unit 140 may be cooled by air passing through the second hole 120b.

A middle portion (no reference numeral) of the rear housing 120 may connect the first housing 121 and the second housing 122 at between the first housing 121 and the second housing 122. For example, the first housing 121, the second housing 122, and the middle portion may be formed as one body.

In addition, the first boss 56a may penetrate the first housing 121, and the second boss 56b may penetrate the second housing 122. Accordingly, the first boss 56a and the second boss 56b may guide the coupling of the rear housing 120 with respect to the base 55 and the front housing 110.

In addition, a fastening member (not shown) may penetrate the middle portion, and may be fastened to the first lower fixing portion 26a. A first fastening member Fa may penetrate the first housing 121, and may be fastened to the third lower fixing portion 56c. A second fastening member Fb may penetrate the first housing 121, and may be fastened to the first plate fixing portion 57a. A third fastening member Fc may penetrate the first housing 121, and may be fastened to the first housing fixing portion 116a. A fourth fastening member Fd may penetrate the first housing 121 and the first board pin 117a, and may be fastened to the inside of the front housing 110 (see FIG. 16). A fifth fastening member (not shown) may penetrate the second housing 122, and may be fastened to the second lower fixing portion 26b. A sixth fastening member (Fe) may penetrate the second housing 122, and may be fastened to the second plate fixing portion 57b. A seventh fastening member Ff may penetrate the second housing 122, and may be fastened to the second housing fixing portion 116b. An eighth fastening member Fg may penetrate the second housing 122 and the second board pin 117b, and may be fastened to the inside of the front housing 110.

Accordingly, the communication module 100 may be coupled to the frame 20, the pressing portion 25 (see FIG. 7), the second part 32, and the base 55, and the rigidity of the communication module 100 may be enhanced.

Meanwhile, the fastening members may be a screw. In addition, the fastening members may be spaced apart from the antenna unit 130, 140 by a certain distance or more. The fastening members may not overlap the antenna unit 130, 140 in the front-rear direction. Accordingly, beam distortion and performance degradation of the antenna unit 130, 140 caused by the fastening members may be minimized.

Meanwhile, the press portion 174 may be located between the first housing 121 and the second housing 122. The holder 190 may be fixed to the first housing 121 and the second housing 122. A cable passage HL may be formed between the holder 190 and the middle portion.

Referring to FIGS. 13 and 14, the first antenna unit 130 and the second antenna unit 140 may be spaced apart from the inside of the front housing 110 and the inside of the rear housing 120.

In the front-rear direction, the front surface of the first antenna unit 130 and the front surface of the second antenna unit 140 may be spaced apart from the front housing 110 by a first gap ga. In the front-rear direction, the rear surface of the first plate 171 and the rear surface of the second plate 172 may be spaced apart from the inside of the rear housing 120 by a second gap gb. In the up-down direction, the upper end of the first antenna unit 130 and the upper end of the second antenna unit 140 may be spaced apart from the front housing 110 by a third gap gc. In the up-down direction, the lower end of the first antenna unit 130 and the lower end of the second antenna unit 140 may be spaced apart from the front housing 110 by a fourth gap gd.

For example, the first gap ga may be 1 to 4.5 mm, and the fourth gap gd may be 1 mm or less. For example, the second gap gb may be larger than the first gap ga, and the third gap gc may be larger than the fourth gap gd. For example, the left side of the first antenna unit 130 may be spaced apart from the left side of the front housing 110 by a gap of 0.5 mm or less. For example, the right side of the second antenna unit 130 may be spaced apart from the right side of the front housing 110 by a gap of 0.5 mm or less.

For example, the thickness ta of the front end of the front housing 110, the thickness tb of the lower end, the thickness of the left end, and the thickness of the right end may be 1 to 1.5 mm. For example, the front housing 110 may include resin. For example, the front housing 110 may include polycarbonate PC.

Accordingly, beam distortion and performance degradation of the first antenna unit 130 and the second antenna unit 140 caused by the front housing 110 may be minimized.

The thickness of the rear housing 120 may be 1 to 1.5 mm. For example, the rear housing 120 may include resin. For example, rear housing 120 may include PC ABS.

Accordingly, beam distortion and performance degradation of the first antenna unit 130 and the second antenna unit 140 caused by the rear housing 120 may be minimized. In addition, the heat from the first antenna unit 130 and the second antenna unit 140 may be easily radiated to the outside through the rear housing 120.

Meanwhile, a contact portion 110u of the front housing 110 may contact the lower side of the vertical portion 32V, and may be spaced rearward from the front end of the vertical portion 32V. The front surface 110t of the front housing 110 may be inclined rearward with respect to the contact portion 110u (see theta 1). The lower surface 110d of the front housing 110 may be spaced upward from the lower end 120e of the rear housing 120.

In addition, among the antennas provided on the front surface of the first antenna unit 130, an imaginary straight line connecting the antenna TPa disposed closest to the vertical portion 32V and the front end of the vertical portion 32V may form a certain angle (theta a) with respect to an imaginary straight line parallel to the front-rear direction. As the angle (theta a) increases, the radio wave reception range of the antenna TPa may increase, but the height of the communication module 100 protruding downward from the vertical portion 32V may increase. For example, the angle (theta a) may be approximately 30 degrees. Accordingly, a sufficient radio wave reception range of the antenna TPa can be secured without significantly increasing the height of the communication module 100.

In addition, among the antennas provided on the front surface of the first antenna unit 140, an imaginary straight line connecting the antenna TPb disposed closest to the vertical portion 32V and the front end of the vertical portion 32V may form a certain angle (theta b) with respect to an imaginary straight line parallel to the front-rear direction. As the angle (theta b) increases, the radio wave reception range of the antenna TPb may increase, but the height of the communication module 100 protruding downward from the vertical portion 32V may increase. For example, the angle (theta b) may be approximately 30 degrees. Accordingly, a sufficient radio wave reception range of the antenna TPa can be secured without significantly increasing the height of the communication module 100. For example, the angle theta b may be substantially equal to the angle theta a.

Referring to FIG. 15, the cable C may transmit digital video data and timing control signals from the timing controller board 52 to the display panel 10 (see FIG. 3). A first cable Ca may electrically connect the second board 53 and the timing controller board 52. A second cable Cb may electrically connect the first board 54 and the second board 53, and may be a flexible flat cable FFC. A third cable Cc may electrically connect the first and second antenna units 130 and 140 of the communication module 100 and the first board 54. A fourth cable Cd may electrically connect the second board 53 and the first board 54, and may be a power cable. A fifth cable Ce may electrically connect the second board 53 and the first and second antenna units 130 and 140 of the communication module 100, and may be a power cable.

For example, the first board 54 may be referred to as a RF receiver 54, a RF processor 54, or a WAV board 54. In addition, the third cable Cc may be a radio frequency cable (RF cable) Cc. In this case, as the length of the third cable Cc increases, the loss rate of the data transmitted from the communication module 100 to the first board 54 may increase. For example, the length of the third cable Cc may be about 300 mm or less. In this case, the distance d11 between the lower end of the communication module 100 and the vertical portion 32V of the second part 32 and the distance d12 between the vertical portion 32V and the upper end of the first board 54 may be designed in such a way that the length of the third cable Cc can be arranged to be 300 mm. That is, the first board 54 may be disposed closer to the second part 32 than to the first part 31. In other words, the communication module 100 may be provided at the edge of the display device, the antenna unit 130, 140 may be located outside of the edge, the WAV board 54 may be located within a certain distance inside the edge, and the length of the RF cable Cc may be 300 mm or less. Accordingly, the data loss rate caused by the third cable Cc may be minimized.

Meanwhile, the first board 54 may be a relatively high temperature heat source. The first board 54 may be spaced downward from the timing controller board 52. The timing controller board 52 may be disposed closer to the first part 31 than to the second part 32. For example, the distance d21 between the upper end of the first board 54 and the lower end of the timing controller board 52 is greater than the distance d12 between the vertical portion 32V and the upper end of the first board 54. Accordingly, damage or performance degradation of the timing controller board 52 due to heat of the first board 54 may be minimized.

For example, the second board 53 may be an AMP board 53 or a main board 53. The heating value of the second board 53 may be less than that of the first board 54. In this case, the second board 53 may be spaced left or right from the timing controller board 52. For example, the distance d13 between the left distal end of the second board 53 and the right distal end of the timing controller board 52 may be smaller than the distance d21 between the upper end of the first board 54 and the lower end of the timing controller board 52. Accordingly, in comparison with a case where the AMP board 53 is integrated with or located adjacent to the WAV board 54, heat transmitted to the timing controller board 52 may be reduced.

A heat sink 540 may be coupled to the rear surface of the first board 54. The heat sink 540 may include a material having an excellent thermal conductivity, such as metal. For example, the heat sink 540 may extend left and/or right from the first board 54. For another example, the heat sink 540 may extend upward from the first board 54. In this case, the timing controller board 52, the heat sink 540, the first board 54, and the communication module 100 may be located on the center line V-V' of the display device. Further, the vertical line VI-VI' passing through the center of the second board 53 may be eccentric to a certain distance e to the right with respect to the center line V-V'. In addition, the upper end of the heat sink 540 may be spaced downward by a certain distance d22 from the lower end of the timing controller board 52.

Accordingly, the heat of the first board 54 may be transmitted to the heat sink 540, and damage or performance degradation of the timing controller board 52 due to the heat of the first board 54 and/or the heat sink 540 may be minimized.

Meanwhile, a buffer member 541 may be coupled or attached to the rear surface of the heat sink 540. The buffer member 541 may be disposed between the heat sink 540 and the back cover 40 (see FIG. 3), and may relieve external force applied to the back cover 40. For example, the buffer member 541 may be a sponge.

According to an aspect of the present disclosure, a display device includes: a display panel; a frame which is positioned behind the display panel and to which the display panel is coupled; a communication module protruding from one side of the frame to the outside of the frame and including an antenna unit; and a first board coupled to the frame and electrically connected to the communication module, wherein the first board is disposed closer to the one side than the other side of the frame opposite to the one side.

In addition, according to another aspect of the present disclosure, the display device may further include a cable electrically connected to the antenna unit and the first board and transmitting data from the communication module to the first board, wherein the cable may be a RF cable.

In addition, according to another aspect of the present disclosure, a length of the RF cable may be 300 mm or less.

In addition, according to another aspect of the present disclosure, the display device may further include a T-CON board coupled to the frame and electrically connected to the display panel, wherein the T-CON board may be disposed closer to the other side than to the one side of the frame.

In addition, according to another aspect of the present disclosure, the T-CON board may be aligned with the first board in an up-down direction.

In addition, according to another aspect of the present disclosure, the display device may further include a second board coupled to the frame and electrically connected to the T-CON board and the first board, wherein the second board may be eccentric to a left side or right side with respect to the T-CON board.

In addition, according to another aspect of the present disclosure, the first board may be a WAV board, and the second board may be an AMP board.

In addition, according to another aspect of the present disclosure, the display device may further include a heat sink which is coupled to a rear surface of the first board, wherein a portion of the heat sink may be located spaced apart from the first board, and the heat sink may be spaced apart from the T-CON board.

In addition, according to another aspect of the present disclosure, the T-CON board may be spaced upward from the first board, wherein the heat sink may extend upward from the first board, and an upper end of the heat sink may be spaced apart from a lower end of the T-CON board.

In addition, according to another aspect of the present disclosure, the display device may further include: a back cover covering a rear of the frame; and a buffer member positioned between the heat sink and the back cover, and coupled to a rear surface of the heat sink.

In addition, according to another aspect of the present disclosure, the display device may further include a side frame extending along the one side of the frame and fixed to the one side of the frame, wherein the antenna unit includes antennas which is provided on a front surface of the antenna unit, which is positioned below the side frame, and which is positioned in a rear of a front end of the side frame.

In addition, according to another aspect of the present disclosure, an imaginary straight line connecting an antenna closest to the side frame among the antennas and the front end of the side frame may form an angle of 30 degrees with respect to an imaginary straight line parallel to a front-rear direction.

In addition, according to another aspect of the present disclosure, the communication module may include a housing which provides an internal space where the antenna unit is located, wherein the antenna unit may be located below a lower side of the frame, wherein the antenna unit may include: a front antenna provided at a front surface of the antenna unit; a left antenna provided at a left surface of the antenna unit; a right antenna provided at a right surface of the antenna unit; and a lower antenna provided at a lower surface of the antenna unit, wherein the housing may be spaced apart from the front antenna, the left antenna, the right antenna, and the lower antenna.

In addition, according to another aspect of the present disclosure, a thickness of the housing may be 1 to 1.5 mm, and a material of the housing may be polycarbonate (PC).

In addition, according to another aspect of the present disclosure, the housing may be coupled to the frame through a fastening member, wherein the fastening member is spaced apart from the antenna unit, and may not overlap with the antenna unit in a front-rear direction.

In addition, according to another aspect of the present disclosure, the antenna unit may include: a first antenna unit; and a second antenna unit spaced apart from the first antenna unit in a longitudinal direction of the one side of the frame, wherein the first antenna unit and the second antenna unit may have a different polarization characteristic.

Certain embodiments or other embodiments of the disclosure described above are not mutually exclusive or distinct from each other. Any or all elements of the embodiments of the disclosure described above may be combined or combined with each other in configuration or function.

For example, a configuration "A" described in one embodiment of the disclosure and the drawings and a configuration "B" described in another embodiment of the disclosure and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
   a display panel;
   a frame which is positioned behind the display panel and to which the display panel is coupled;
   a communication module protruding from one side of the frame to an outside of the frame and including an antenna unit; and
   a first board coupled to the frame and electrically connected to the communication module,
   wherein the first board is disposed closer to the one side than an other side of the frame opposite to the one side,
   a T-CON board coupled to the frame and electrically connected to the display panel, wherein the T-CON board is disposed closer to the other side than to the one side of the frame, and wherein the T-CON board is aligned with the first board in an up-down direction, and a second board coupled to the frame and electrically connected to the T-CON board and the first board, wherein the second board is eccentric to a left side or right side with respect to the T-CON board.

2. The display device of claim 1, further comprising a cable electrically connected to the antenna unit and the first board and transmitting data from the communication module to the first board, wherein the cable is a RF cable.

3. The display device of claim 2, wherein a length of the RF cable is 300 mm or less.

4. The display device of claim 1, wherein the first board is a WAV board, and the second board is an AMP board.

5. The display device of claim 1, further comprising a heat sink which is coupled to a rear surface of the first board, wherein a portion of the heat sink is located spaced apart from the first board, wherein the heat sink is spaced apart from the T-CON board.

6. The display device of claim 5, wherein the T-CON board is spaced upward from the first board, wherein the heat sink extends upward from the first board, and an upper end of the heat sink is spaced apart from a lower end of the T-CON board.

7. The display device of claim 5, further comprising:

a back cover covering a rear of the frame; and a buffer member positioned between the heat sink and the back cover and coupled to a rear surface of the heat sink.

8. The display device of claim 1, further comprising a side frame extending along the one side of the frame and fixed to the one side of the frame, wherein the antenna unit comprises antennas which are provided on a front surface of the antenna unit, which is positioned below the side frame, and which is positioned in a rear of a front end of the side frame.

9. The display device of claim 8, wherein a straight line connecting an antenna closest to the side frame among the antennas and the front end of the side frame forms an angle of 30 degrees with respect to a straight line parallel to a front-rear direction.

10. The display device of claim 1, wherein the communication module comprises a housing which provides an internal space where the antenna unit is located, wherein the antenna unit is located below a lower side of the frame, wherein the antenna unit comprises:

a front antenna provided at a front surface of the antenna unit;

a left antenna provided at a left surface of the antenna unit;

a right antenna provided at a right surface of the antenna unit; and a lower antenna provided at a lower surface of the antenna unit, wherein the housing is spaced apart from the front antenna, the left antenna, the right antenna, and the lower antenna, wherein a thickness of the housing is 1 to 1.5 mm, and a material of the housing is polycarbonate (PC).

11. The display device of claim 10, wherein the housing is coupled to the frame through a fastening member, wherein the fastening member is spaced apart from the antenna unit, and does not overlap with the antenna unit in a front-rear direction.

12. The display device of claim 1, wherein the antenna unit comprises:

a first antenna unit; and a second antenna unit spaced apart from the first antenna unit in a longitudinal direction of the one side of the frame, wherein the first antenna unit and the second antenna unit have a different polarization characteristic.

13. A display device comprising:

a display panel;

a frame which is positioned behind the display panel and to which the display panel is coupled;

a communication module protruding from one side of the frame to an outside of the frame and including an antenna unit; and a first board coupled to the frame and electrically connected to the communication module, wherein the first board is disposed closer to the one side than an other side of the frame opposite to the one side, a T-CON board coupled to the frame and electrically connected to the display panel, wherein the T-CON board is disposed closer to the other side than to the one side of the frame, and a heat sink which is coupled to a rear surface of the first board, wherein a portion of the heat sink is located spaced apart from the first board, wherein the heat sink is spaced apart from the T-CON board.

14. A display device comprising:

a display panel;

a frame which is positioned behind the display panel and to which the display panel is coupled;

a communication module protruding from one side of the frame to an outside of the frame and including an antenna unit; and a first board coupled to the frame and electrically connected to the communication module, wherein the first board is disposed closer to the one side than an other side of the frame opposite to the one side, wherein the communication module comprises a housing which provides an internal space where the antenna unit is located, wherein the antenna unit is located below a lower side of the frame, wherein the antenna unit comprises:

a front antenna provided at a front surface of the antenna unit;

a left antenna provided at a left surface of the antenna unit;

a right antenna provided at a right surface of the antenna unit; and a lower antenna provided at a lower surface of the antenna unit, wherein the housing is spaced apart from the front antenna, the left antenna, the right antenna, and the lower antenna, wherein a thickness of the housing is 1 to 1.5 mm, and a material of the housing is polycarbonate (PC).

* * * * *